(12) United States Patent
Suzuki (10) Patent No.: US 9,425,366 B2
(45) Date of Patent: Aug. 23, 2016

(54) LIGHT EMITTING DEVICE INCLUDING RESIN MEMBER SURROUNDING SIDES OF LIGHT EMITTING ELEMENT

(71) Applicant: NICHIA CORPORATION, Anan-shi, Tokushima (JP)

(72) Inventor: Ryo Suzuki, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/333,748

(22) Filed: Jul. 17, 2014

(65) Prior Publication Data

US 2015/0021641 A1    Jan. 22, 2015

(30) Foreign Application Priority Data

Jul. 19, 2013    (JP) ................. 2013-150181

(51) Int. Cl.
*H01L 33/50* (2010.01)
*H01L 33/00* (2010.01)
*H01L 33/54* (2010.01)
*H01L 33/56* (2010.01)

(52) U.S. Cl.
CPC ............ *H01L 33/502* (2013.01); *H01L 33/505* (2013.01); *H01L 33/007* (2013.01); *H01L 33/54* (2013.01); *H01L 33/56* (2013.01); *H01L 2224/14* (2013.01); *H01L 2224/16225* (2013.01); *H01L 2224/32225* (2013.01); *H01L 2224/73204* (2013.01); *H01L 2924/181* (2013.01); *H01L 2933/0041* (2013.01)

(58) Field of Classification Search
CPC ...... H01L 33/502; H01L 33/54; H01L 33/505; H01L 33/007; H01L 33/56; H01L 2933/041
USPC ........................................................... 257/98
See application file for complete search history.

(56) References Cited

U.S. PATENT DOCUMENTS

| | | | | |
|---|---|---|---|---|
| 2009/0101929 A1* | 4/2009 | Mo et al. | .......................... | 257/98 |
| 2011/0108865 A1* | 5/2011 | Aldaz et al. | ....................... | 257/98 |
| 2011/0220934 A1* | 9/2011 | Gotoda | ............... | H01L 33/0079 257/98 |
| 2012/0224363 A1* | 9/2012 | Van De Ven | .............. | F21K 9/56 362/231 |
| 2013/0285090 A1* | 10/2013 | Furuyama | ............. | H01L 33/501 257/98 |
| 2014/0061704 A1* | 3/2014 | Yamada et al. | .................. | 257/98 |

FOREIGN PATENT DOCUMENTS

JP    2012-156443 A    8/2012

* cited by examiner

*Primary Examiner* — Peter Bradford
(74) *Attorney, Agent, or Firm* — Global IP Counselors, LLP (57) ABSTRACT

A light emitting device includes a substrate member, a light emitting element, a resin member, an insulating layer and a fluorescent material layer. The light emitting element is arranged on the substrate member. The resin member surrounds sides of the light emitting element, and has a top portion located higher than a light emission surface of the light emitting element. The insulating layer covers the light emission surface of the light emitting element and an outer wall surface and an inner wall surface of the top portion of the resin member. The fluorescent material layer covers a surface of the insulating layer.

11 Claims, 7 Drawing Sheets

LIGHT EMITTING DEVICE INCLUDING RESIN MEMBER SURROUNDING SIDES OF LIGHT EMITTING ELEMENT

CROSS-REFERENCE TO RELATED APPLICATION

This application claims priority to Japanese Patent Application No. 2013-150181, filed on Jul. 19, 2013. The entire disclosure of Japanese Patent Application No. 2013-150181 is hereby incorporated herein by reference.

BACKGROUND OF THE INVENTION

1. Technical Field

The present disclosure relates to a light emitting device.

2. Background Art

There has been proposed a light emitting device which includes a substrate, a light emitting element arranged on the substrate, and a reflecting member which surrounds the underside and sides of the light emitting element (see, for example, Patent Literature 1: JP 2012-156443A).

SUMMARY

An object of the disclosure is to provide a light emitting device in which occurrence of color unevenness can be suppressed.

Embodiments of the present invention can provide a light emitting device which can suppress color unevenness.

DETAILED DESCRIPTION OF EMBODIMENTS

Next, embodiments of the invention will be described with reference to the drawings. In the description of the drawings below, the same or similar components are denoted by the same or similar reference symbols. However, it should be noted that the drawings are drawn schematically, and the dimensional ratios and the like of the components may differ from the actual ratios. Accordingly, the specific dimension and the like should be determined in consideration of the description below. In addition, it is needless to say that the drawings may also include the components that have different dimensional relations and ratios among one another.

Structure of Light Emitting Device 100

A structure of a light emitting device 100 according to an embodiment will be described with reference to the drawings.

Figure 1:
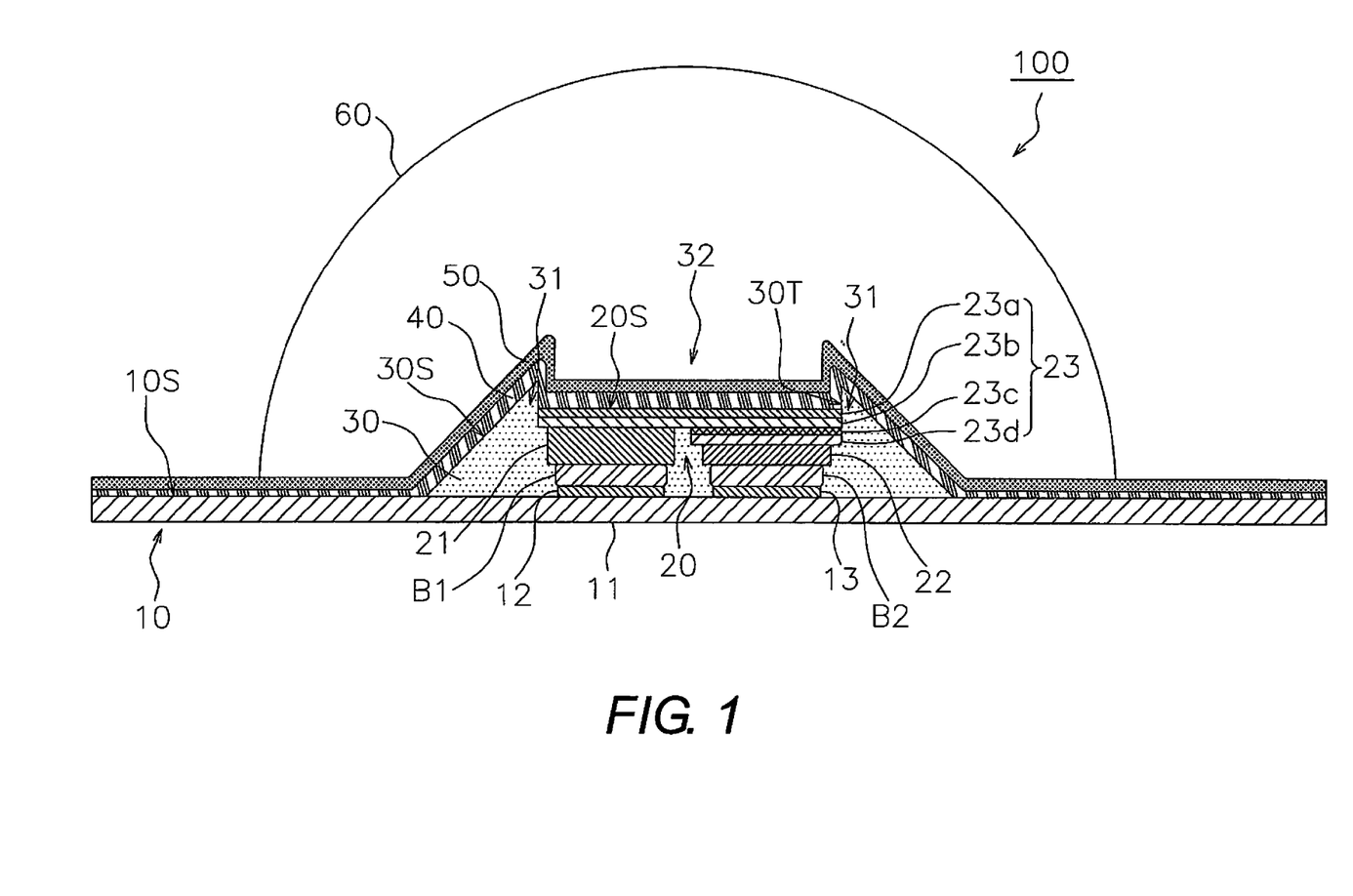
FIG. 1 is a schematic cross-sectional view showing a schematic structure of a light emitting device.
Figure 2:
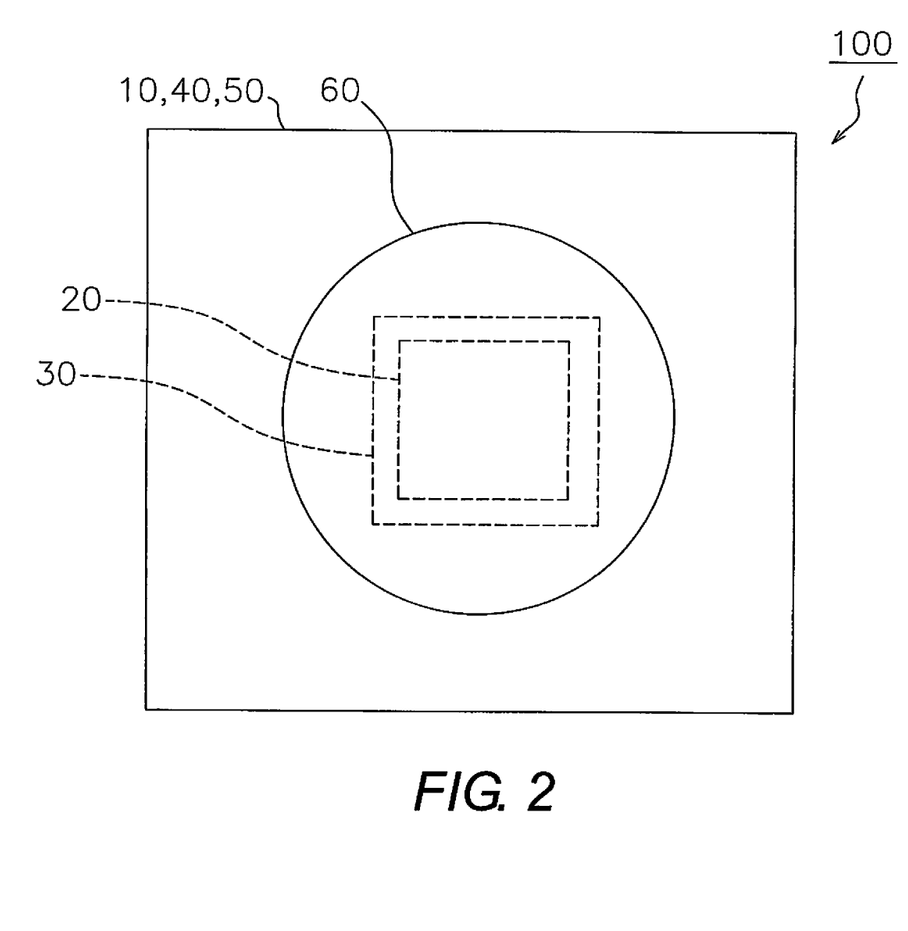
FIG. 2 is a schematic plan view showing the light emitting device.

FIG. 1 is a schematic cross-sectional view showing a structure of a light emitting device 100. FIG. 2 is a schematic plan view showing the light emitting device 100.

A light emitting device 100 includes a substrate member 10, at least one light emitting element 20, a resin member 30, an insulating layer 40, a fluorescent material layer 50, and a mold member 60.

The substrate member 10 includes a substrate body 11, an n-side wiring electrode 12, and a p-side wiring electrode 13.

The substrate body 11 is made of an electrically insulating material. Examples of electrically insulating material include glass epoxy and silicone glass, ceramics such as alumina and aluminum nitride, and LTCC (low-temperature calcinated ceramic).

The n-side wiring electrode 12 and the p-side wiring electrode 13 are arranged on the surface 10S of the substrate member 10. The n-side wiring electrode 12 and the p-side wiring electrode 13 are connected to respective external electrodes.

The light emitting element 20 include an n-side electrode 21, a p-side electrode 22, and a semiconductor layer 23.

The n-side electrode 21 is connected to an n-side wiring electrode 12 via, for example, a bump B1 made of Au. The p-side electrode 22 is connected to a p-side wiring electrode 13 via, for example, a bump B2 made of Au. The light emitting element 20 and the substrate member 10 are to be electrically and physically connected, which can be satisfied by the use of an electrically conductive bonding material (for example, a solder material), as an alternative to the use of the bumps B1, B2. Examples of the constituent materials of the n-side electrode 21 and the p-side electrode 22 include Au, Ni, Ti, and Al.

The semiconductor layer 23 is disposed on the n-side electrode 21 and the p-side electrode 22. The semiconductor layer 23 includes an n-type buffer layer 23a, an n-type semiconductor layer 23b, an active layer 23c, and a p-type semiconductor layer 23d. The n-type buffer layer 23a, the n-type semiconductor layer 23b, and the p-type semiconductor layer 23d may be constituted with at least one of, for example, gallium nitride, aluminum gallium nitride, and aluminum nitride, but are not limited thereto. The active layer 23c can be constituted with indium gallium nitride, but is not limited thereto. In the present embodiment, the n-type buffer layer 23a serves as the light emission surface 20S of the light emitting element 20, but a different layer than the n-type buffer layer 23a may serve as the light emission surface 20S. The light emission surface 20S may be constituted with, for example, the n-type semiconductor layer or a growth substrate (a sapphire substrate). The light emission surface 20S of the light emitting element 20 is surrounded by a resin member 30 which has a top portion 31 located higher (an upper side) than the light emission surface 20S. The light emission surface 20S is covered with the insulating layer 40.

The resin member 30 surrounds the sides of the light emitting element 20. The resin member 30 covers the whole periphery of side surfaces of the light emitting element 20. The resin member 30 supports the semiconductor layer 23 during a laser lift-off operation (see FIG. 5C) to be described below. Accordingly, the resin member 30 is preferably filled between the substrate member 10 and the light emitting element 20.

The resin member 30 is further disposed to be in contact with each of the side surfaces of the light emitting element 20 so as to be narrower (smaller in the thickness as measured in a direction parallel to the substrate 10) as the distance from the substrate member 10 increases (i.e. toward the upper side). The top portions 31 of the resin member 30 are located at higher positions (upper side) than the light emission surface 20S of the light emitting element 20. That is, a recess 32 is defined by the light emission surface 20S of the light emitting element 20 as its bottom surface and the resin member 30 as its wall portion. Such a recess 32 may be formed by, as described below, disposing a resin member 30 reaching to the side surfaces of the sapphire substrate 70 and removing the sapphire substrate 70 from the semiconductor layer 23 side so that the plane of the light emission surface 20S is lowered by the thickness of the sapphire substrate 70. Of the resin member 30, the distance (i.e. height) between the light emission surface 20S of the light emitting element 20 and the top portions 31 is approximately the same as the thickness of the sapphire substrate 70 which is about 10 μm to about 150 μm.

The resin member 30 includes outer wall surfaces 30S and inner wall surfaces 30T. In the present embodiment, the outer wall surfaces 30S and the inner wall surfaces 30T of the top portions 31 (portions of the inner wall surfaces which are higher than the side surfaces of the light emitting element) are covered with an insulating layer 40.

The resin member 30 can be made of at least one insulating materials selected from, for example, a silicone resin, an epoxy resin, and a fluororesin. Particularly, a silicone resin which has high heat-resisting property and high light-resisting property is preferable. Also, the resin member 30 preferably contains a light-reflecting member. For example, a white filler material such as titanium oxide, silicon oxide, or alumina may be mixed in the resin member 30 to improve the light extraction efficiency of the light emitting device 100. In addition, mixing of such a filler material allows for enhancing the strength of the resin member 30, so that the holding strength of the semiconductor layer 23 during laser lift-off of the sapphire substrate 70 or after the completion of the light emitting device 100 can be enhanced. Thus, reliability in the event of detachment of the substrate member 10 or in use of the light emitting device 100 can be improved.

The insulating layer 40 at least covers the light emission surface 20S of the light emitting element 20 and the outer wall surfaces 30S, the inner wall surfaces 30T, and the top portions 31 of the resin member 30. The insulating layer 40 has light-transmissive property. The insulating layer 40 can be constituted with, for example, an oxide of at least one element of Si and Al (more specifically $SiO_2$, $Al_2O_3$ etc.) The insulating layer 40 can have a thickness of about 0.1 μm to about 5 μm, for example.

The insulating layer 40 may be a single layer or has a stacked-layer structure. Particularly, in the case where the fluorescent material layer 50 to be described below is formed by way of electrodeposition or electrostatic deposition, a stacked-layer structure is preferably employed.

In this case, first, an insulating layer (see the insulating layer 40a in FIG. 6A) is disposed, then an electrically conductive layer (see the electrically conductive layer 40b in FIG. 6B) is disposed prior to dispose the fluorescent layer 50. After disposing the fluorescent material layer 50, an insulating processing is performed to make the electrically conductive layer into insulating. As described above, initially forming a stacked layer structure having an electrically conductive layer on an insulating layer, then performing an insulating processing, an insulating layer made of a plurality of layers with an insulating layer on an insulating layer may be formed. Moreover, an insulating layer obtained by insulating an electrically conductive layer by processing as described above is needed to be light-transmissive after insulated. Examples of the materials thereof include aluminum (which becomes insulating and light-transmissive aluminum oxide The electrically conductive layer formed on an insulating layer can retain its conductivity, as long as it is light-transmissive. In the case the layer is used retaining its conductivity, in order to prevent short circuit, the layer is needed to be disposed on the insulating layer and also at a position so as not to be in contact with the wiring for external connection of the substrate member 10. Such a light-transmissive electrically conductive layer can be made of, for example, an oxide of at least one element of Zn, In, and Sn (more specifically, ITO, ZnO, $In_2O_3$, $SnO_2$ etc). The light-transmissive electrically conductive layer may be made with a light-transmissive metal layer formed in a mesh shape or a matrix shape, or a metal layer of Ag, Au, Cu, Ni etc., with a thickness which allows light to transmit therethrough. The thickness of the light-transmissive electrically conductive layer can be designed appropriately in view of the light-absorbing property, the electric resistance property, and the emission wavelength, and for example, a thickness of 0.3 μm or less can be employed.

The fluorescent material layer 50 covers the surface of the insulating layer 40 which is disposed on the inner wall surfaces 30T, the outer wall surfaces 30S, including the top portions of the resin member 30. In the present embodiment, the fluorescent material layer 50 covers, as shown in FIG. 2, the entire upper surface of the insulating layer 40. In the case where a light-transmissive electrically conductive layer is disposed on the insulating layer 40, the fluorescent material layer 50 may cover the surface of the light-transmissive electrically conductive layer. As described above, disposing the fluorescent material layer 50 not only on the light emission surface 20S of the light emitting element 20 but also on the surface of the resin member 30 which is disposed surrounding the emission surface 20S, color unevenness can be reduced. In detail, covering the external surfaces 30S, the inner wall surfaces 30T, including the top portions 31 of the resin member 30, at the region of the resin member 30 which has a smaller thickness, particularly the portion apart from the substrate member (i.e. upper side) allows reliable irradiation of light from the light emitting element 20 on the fluorescent material layer 50, even in the case where the thickness of the resin member 30 is small to allow light to transmit therethrough, and therefore, color unevenness can be reduced.

The fluorescent material layer 50 preferably has a thickness which is approximately uniform over the light emission surface 20S and over the resin member 30. Particularly, as shown in FIG. 1, the fluorescent material layer 50 preferably has a thickness which is smaller than the distance (height) from the light emission surface 20S of the light emitting element 20 to the top portions 31 of the resin member 30, and preferably covers the surface of the resin member with such a thickness. More specifically, the fluorescent material layer 50 preferably has a thickness of about 5 μm to about 50 μm. The portions of the resin member 30 near the top portions 31 have a small thickness, so that disposition of the fluorescent material layer 50 with a large thickness may result in a reduction in the light extraction efficiency, and therefore undesirable.

The fluorescent material layer 50 absorbs at least a part of emission from the light emitting element 20 and emits light of a different wavelength. The fluorescent material layer 50 can be constituted with, for example, a nitride-based fluorescent material and/or an oxynitride-based fluorescent material which contains a lanthanoid series element such as Eu and Ce. The fluorescent material layer 50 may contain either one type of fluorescent material or plural types of fluorescent materials. The fluorescent material layer 50 may have a single-layer structure or a multi-layer structure.

The molding member 60 seals the light emitting element 20 on the substrate member 10. The mold member 60 is to protect the light emitting element 20 from dust, moisture, or external force. Examples of the materials of the mold member 60 include a silicone resin, an epoxy resin, a urea resin, and glass. The mold member 60 may contain a coloring agent, a light diffusing agent, and/or a filler material. Forming the mold member 60 in a lamp shape or a convex-lens shape allows the mold member 60 to serve as a lens.

Method of Manufacturing Light Emitting Device 100

Next, a method of manufacturing the light emitting device 100 will be described with reference to the drawings. FIG. 3A through FIG. 7 are diagrams for illustrating a method of manufacturing the light emitting device 100.

First, a light emitting element having a semiconductor layer 23 is prepared. FIG. 3A through FIG. 4C show an example of a method of manufacturing a light emitting element. In the present embodiment, a method of manufacturing a light emitting device may not include manufacturing of a light emitting element and a prepared light emitting element may be employed.

Figure 3A:
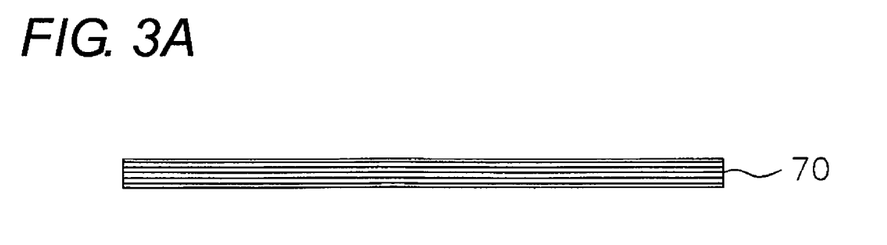
FIGS. 3A to 3C are schematic cross-sectional views for illustrating a method of manufacturing the light emitting device.

First, as shown in FIG. 3A, a sapphire substrate 70 as a base substrate is prepared. The main surface of the sapphire substrate 70 may be flat or may be provided with dimples (protrusions and recesses). In conformity to the dimples, protrusions and recesses are formed on the light emission surface 20S of the light emitting element 20, which allows for reflection of light propagating substantially in parallel to the light emission surface 20S to a direction substantially perpendicular to the emission surface 20S.

Figure 3B:
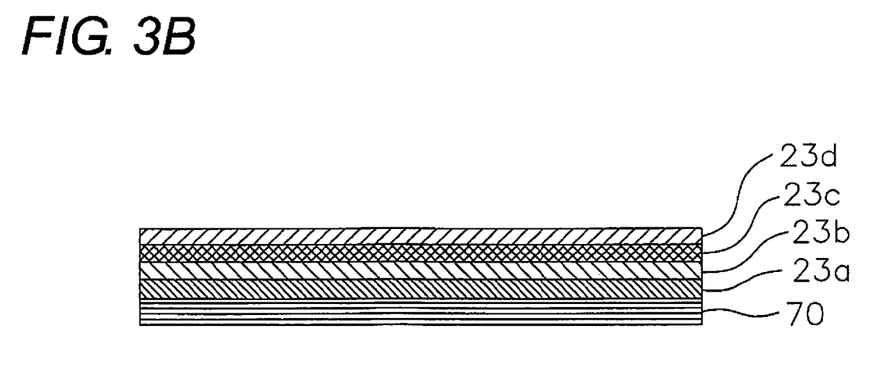

Next, as shown in FIG. 3B, for example, by way of MOVPE (metal organic vapor phase epitaxy), an n-type buffer layer 23a, an n-type semiconductor layer 23b, an active layer 23c and a p-type semiconductor layer 23d are formed in this order on the sapphire substrate 70.

Figure 3C:
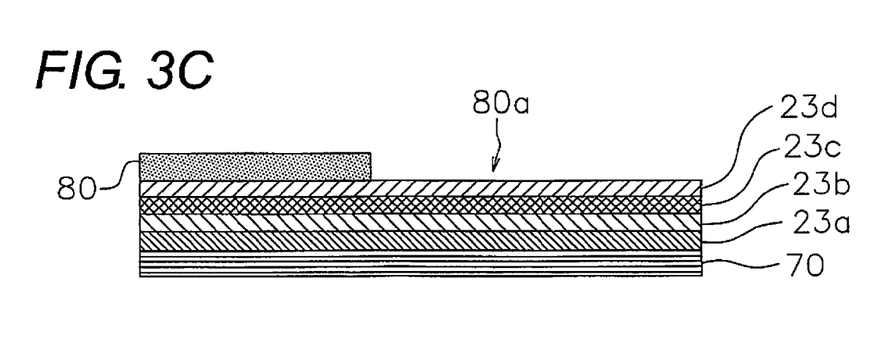

Next, as shown in FIG. 3C, a resist layer 80 is formed on the entire upper surface of the p-type semiconductor layer 23d, and through a mask having openings in a predetermined shape, ultraviolet is irradiated, then the resist layer 80 is developed to form openings 80a in a part of the resist layer 80. In each of the openings 80a, a part of an upper surface of the p-type semiconductor layer 23d is exposed.

Figure 4A:
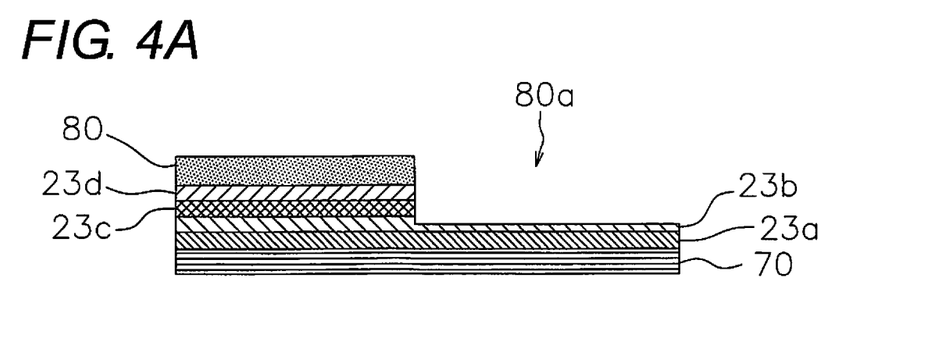
FIGS. 4A to 4C are schematic cross-sectional views for illustrating the method of manufacturing the light emitting device.

Then, as shown in FIG. 4A, etching is performed to remove the p-type semiconductor layer 23d, the active layer 23c, and a part of the n-type semiconductor layer 23b which are in each opening 80a. Thus, an exposed surface exposing a part of the n-type semiconductor layer 23b is formed.

Figure 4B:
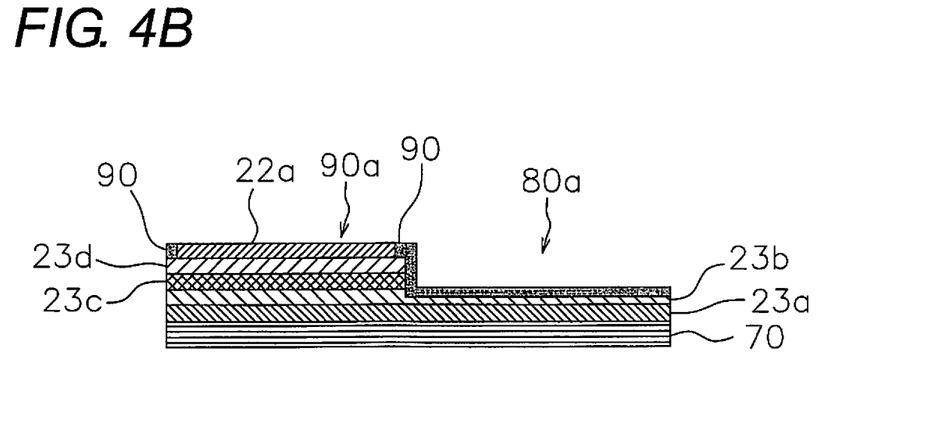

Next, the resist layer 80 is removed to expose the p-type semiconductor layer 23d which remains without being subjected to the etching. Then, as shown in FIG. 4B, a resist layer 90 having openings 90a which are defined approximately in conformity to the upper surface of the p-type semiconductor layer 23d is disposed on the p-type semiconductor layer 23d and the n-type semiconductor layer 23b, and an ohmic electrode 22a is formed in each of the openings 90a, that is on approximately entire portion of the exposed upper surface of the p-type semiconductor layer in each opening 90a. Then, the resist layer 90 is removed.

Figure 4C:
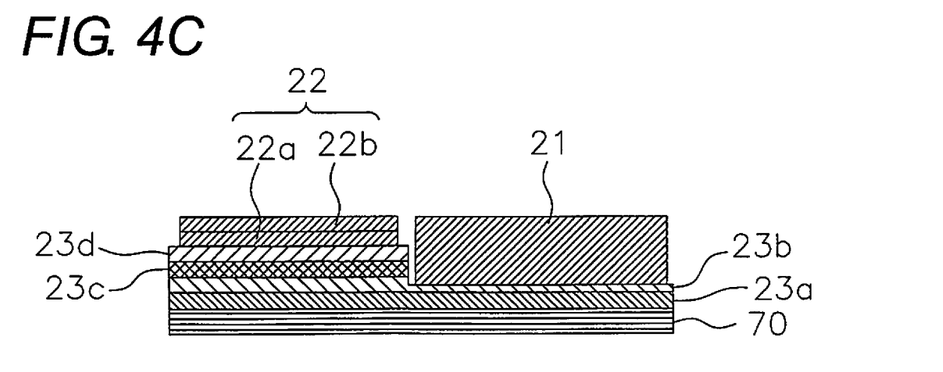

Next, a protective layer having openings in conformity to the upper surface of the ohmic electrodes 22a and the exposed upper surfaces of the n-type semiconductor layer 23b is formed. The protective layer is electrically insulating so as not to create a short circuit between the p-side electrode 22 and the n-side electrode 21. The protective layer is also light-transmissive to allow the light from the light emitting element 20 to pass through. After forming such a protective layer, as shown in FIG. 4C, a p-side pad electrode 22b is formed on the upper surface of each of the ohmic electrodes 22a, and simultaneously an n-side pad electrode (which is an n-side electrode 21) is formed on each of the exposed surfaces of the n-type semiconductor layer 23b. The ohmic electrode 22a and the p-side pad electrode 22b constitute the p-side electrode 22. The n-side electrodes and the p-side electrodes may be formed in different processes. The protective layer may be disposed, besides in the process described above, after forming the p-side and n-side pad electrodes.

Next, the semiconductor layer 23 and the sapphire substrate 70 is cut by way of scribing or the like, to obtain individual light emitting elements 20.

The processes described below are implemented in a same way when using prepared light emitting elements.

Figure 5A:
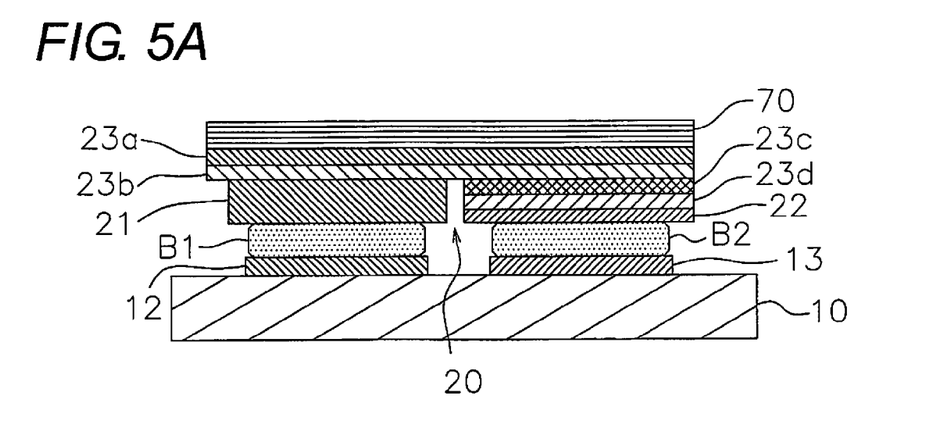
FIGS. 5A to 5C are schematic cross-sectional views for illustrating the method of manufacturing the light emitting device.

Next, in each of the light emitting elements, as shown in FIG. 5A, the n-side electrode 21 is connected to the n-side wiring electrode 12 of the substrate member 10 via the bump B1 and the p-side electrode 22 is connected to the n-side wiring electrode 13 of the substrate member 10 via the bump B2. The bumps B1, B2 may either be disposed at the substrate member 10 side or at the light emitting element 20 side. In the case where a light emitting element 20 with preformed bumps B1, B2 is employed, the process to form the bumps B1, B2 can be eliminated.

Figure 5B:
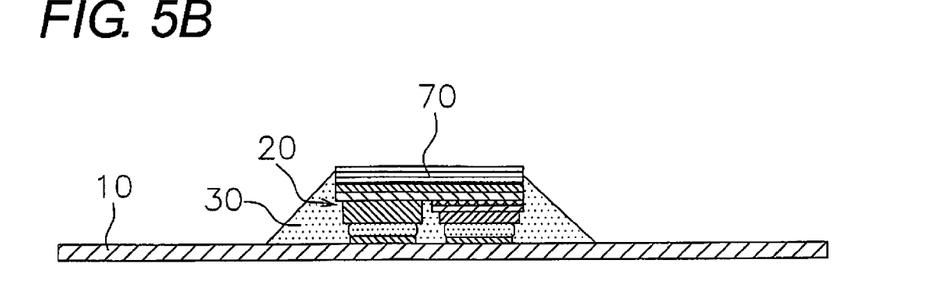

Next, as shown in FIG. 5B, by way of potting, printing, transfer molding, or compression molding, a resin member 30 is formed between the light emitting element 20 and the substrate 10 (underside of the light emitting element 20). In the case where the resin member 30 is formed by way of potting, the viscosity and the use amount of the resin member 30 is adjusted so that the resin member 30 appropriately creeps up from the side surfaces of the light emitting element 20 to the side surfaces of the sapphire substrate. In this case, it is preferable that the resin member 30 is not formed on the light emission surface 20S so as not to affect the laser irradiation of next process. Also, in the case where the resin member 30 is disposed by way of printing, transfer molding, or compression molding, the resin member 30 may be so provided as to cover the upper surface of the light emitting element 20, then a part of the resin member 30 is removed by way of blasting. Thus, the resin member 30 can be formed in a shape, as shown in FIG. 5B, inclined from the upper surface of the substrate member 10 toward the side surfaces of the sapphire substrate 70, in other words, a shape with an upwardly decreasing width (thickness).

Figure 5C:
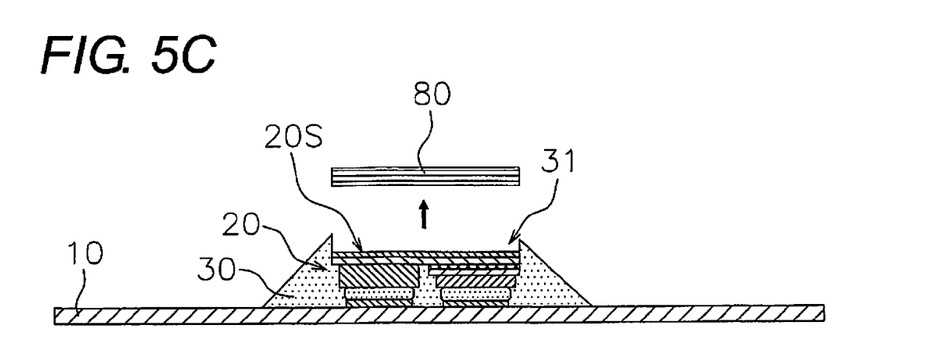

Next, as shown in FIG. 5C, a laser beam (for example Nd:YAG laser beam, KrF excimer laser beam) which can pass through the sapphire substrate 70 is irradiated from the upper surface side (the opposite side from the surface where the semiconductor layer 23 is formed) of the sapphire substrate 70 to induce decomposition reaction at the interface (light emission surface 20S) between the sapphire substrate 70 and the semiconductor layer 23, to remove the sapphire substrate 70 from the semiconductor layer 23. Thus, the resin member 30 with the top portions 31 located higher than the light emission surface 20S of the light emitting element 20 can be formed.

Figure 6A:
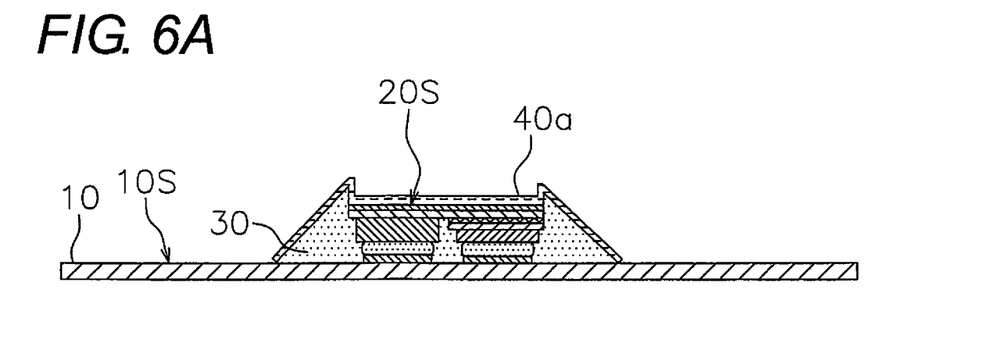
FIGS. 6A to 6C are schematic cross-sectional views for illustrating the method of manufacturing the light emitting device.

Next, as shown in FIG. 6A, an insulating layer 40a is formed to cover the upper surface of the light emitting element 20 and the entire upper surface of the resin member 30. At this time, the insulating member 40a may be formed on a part of the upper surface 10S of the substrate 10. The region to form the insulating layer 40a may be limited by providing a mask etc.

Figure 6B:
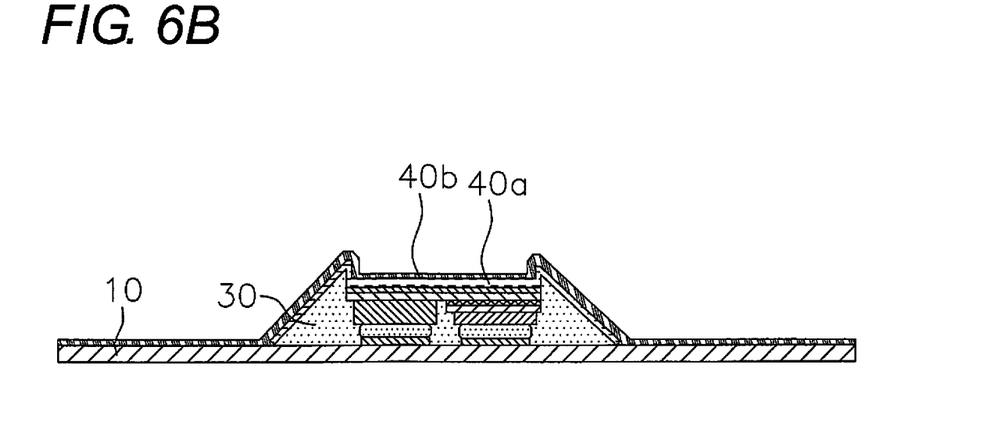

Next, as shown in FIG. 6B, the electrically conductive layer 40b is formed to cover the upper surface 10S of the substrate member 10 and the entire upper surface of the insulating layer 40a.

Figure 6C:
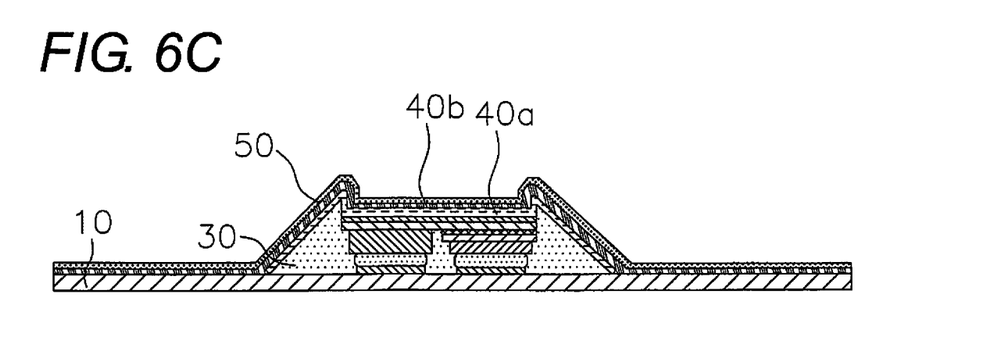

Next, as shown in FIG. 6C, by way of electrodeposition method or electrostatic coating method, the fluorescent material layer 50 is formed to cover the entire surface of the electrically conductive layer 40b. In the case where a member which hardly transmits light is employed for the electrically conductive layer 40b, processing to obtain sufficient light transmissive property is necessary. For example, in the case where aluminum is employed as the electrically conductive layer 40 without change, aluminum absorbs light from the light emitting element 20.

For this reason, oxidation processing is performed to modify aluminum into aluminum oxide.

Figure 7:
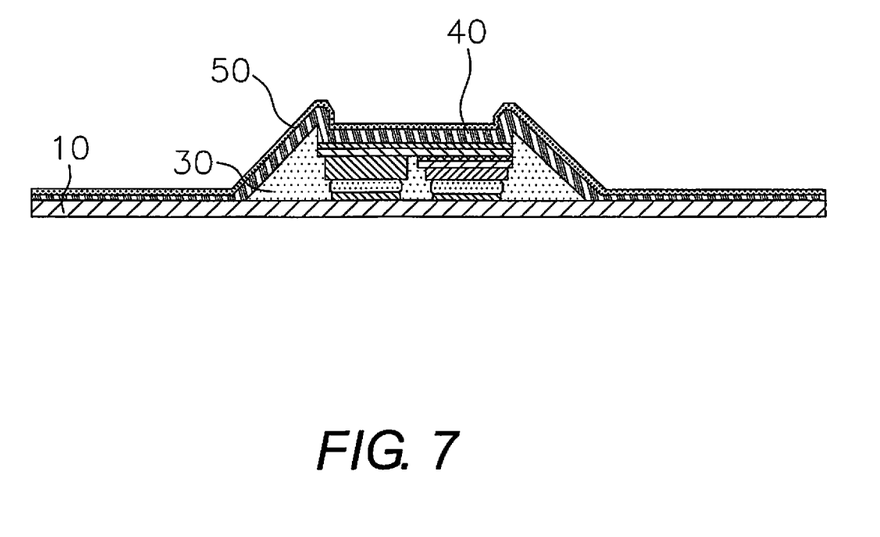
FIG. 7 is a schematic cross-sectional view for illustrating the method of manufacturing the light emitting device.

Next, as shown in FIG. 7, an insulation processing is performed on the electrically conductive layer 40b to form an insulating layer 40 made of the insulating layer 40a and the insulated electrically conductive layer 40b.

Next, a mold member 60 is formed by way of potting method, compression molding method, injection molding method, or printing method. The mold member 60 may directly or indirectly cover the fluorescent material layer 50. At this time, the fluorescent material layer 50 may be impregnated with a mold member 60. Thus, the light emitting device 100 shown in FIG. 1 can be completed.

Performance and Effect

The resin member 30 surrounds the sides of the light emitting element 20. The resin member 30 includes the recess 32 whose bottom surface is defined by the light emission surface 20S of the light emitting element 20. The fluorescent material layer 50 at least covers the light emission surface 20S of the light emitting element 20 and the outer wall surfaces 30S, the inner wall surfaces 30T, and the top portions 31 of the resin member 30. Thus, the color of emission from the light emission surface 20S and the color of reflected light at the outer wall surfaces 30S of the same color system can be obtained, which can therefore suppress color unevenness.

Other Embodiments

The present invention is described with reference to the embodiment illustrated in the accompanying drawings. It should be understood, however, that the description and the drawings are intended as illustrative of the present invention, and the scope of the present invention is not limited to those described above.

The semiconductor layer 23 includes an n-type buffer layer 23a, an n-type semiconductor layer 23b, an active layer 23c, and a p-type semiconductor layer 23d, but is not limited thereto. The semiconductor layer 23 may not include the n-type buffer layer 23a. The semiconductor layer 23 may be a reverse-conductivity type made of a p-type semiconductor layer 23d, an active layer 23c, and an n-type semiconductor layer 23b stacked in this order on a sapphire substrate 70.

In the embodiments shown above, the light emitting device 100 is provided with a single light emitting element 20, but a plurality of light emitting elements 20 may be provided. In this case, the resin member 30 includes a plurality of recessed portions 32 each defined by the bottom surface which is the light emission surface 20S of corresponding light emitting element 20, and the fluorescent material layer 50 covers each of the insulating layers 40 and the resin member 30.

The light emitting device according to the illustrated embodiment can be used for various kinds of light sources, such as illumination light sources, light sources for various kinds of indicators, light sources for automobile use, light sources for displays, back light sources for liquid crystal displays, light sources for sensors, signals, automobile use, channel control characters for channel boards.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
a substrate member;
a light emitting element arranged on the substrate member;
a resin member surrounding sides of the light emitting element, and having a top portion located higher than a light emission surface of the light emitting element;
an insulating layer covering the light emission surface of the light emitting element and an outer wall surface and an inner wall surface of the top portion of the resin member, the insulating layer containing aluminum oxide; and
a fluorescent material layer covering a surface of the insulating layer, wherein
the inner wall surface of the resin member is continuous with the light emission surface of the light emitting element, and
the outer wall surface of the resin member is continuous with the inner wall surface of the resin member at the top portion.

2. The light emitting device according to claim 1, wherein the insulating layer covers at least a part of the substrate member, and
the fluorescent material layer covers an entire surface of the insulating layer.

3. The light emitting device according to claim 1, wherein the resin member has a thickness decreasing as a distance from the substrate member increases.

4. The light emitting device according to claim 1, wherein the resin member contains a light-reflecting member.

5. The light emitting device according to claim 1, wherein the insulating layer has a thickness of 0.3 µm or less.

6. The light emitting device according to claim 1, wherein the fluorescent material layer has a thickness of 5 µm to 50 µm.

7. The light emitting device according to claim 1, further comprising
a mold member covering the fluorescent material layer.

8. A light emitting device comprising:
a substrate member;
a light emitting element arranged on the substrate member;
a resin member surrounding sides of the light emitting element, and containing a light-reflecting member;
an insulating layer covering a light emission surface of the light emitting element and the resin member, the insulating layer containing aluminum oxide; and
a fluorescent material layer covering surfaces of the insulating layer including a surface of a portion of the insulating layer that covers the light emission surface of the light emitting element.

9. The light emitting device according to claim 8, wherein the insulating layer has a thickness of 0.3 µm or less.

10. The light emitting device according to claim 8, wherein the fluorescent material layer has a thickness of 5 μm to 50 μm.

11. The light emitting device according to claim 8, further comprising
a mold member covering the fluorescent material layer.

\* \* \* \* \*